US010131249B2

(12) United States Patent
Goedert et al.

(10) Patent No.: US 10,131,249 B2
(45) Date of Patent: Nov. 20, 2018

(54) CAPACITIVE SEAT OCCUPANCY DETECTION SYSTEM OPERABLE AT WET CONDITIONS

(71) Applicant: IEE International Electronics & Engineering S.A., Echternach (DE)

(72) Inventors: Guenter Goedert, Trier (DE); Oleg Zeiler, Igel (DE); Edmund Marx, Speicher (DE); Ingrid Scheckenbach, Ferschweiler (DE)

(73) Assignee: IEE International Electronics & Engineering S.A., Echternach (LU)

( * ) Notice: Subject to any disclaimer, the term of this patent is extended or adjusted under 35 U.S.C. 154(b) by 0 days.

(21) Appl. No.: 15/552,028

(22) PCT Filed: Feb. 1, 2016

(86) PCT No.: PCT/EP2016/052072
§ 371 (c)(1),
(2) Date: Aug. 18, 2017

(87) PCT Pub. No.: WO2016/131639
PCT Pub. Date: Aug. 25, 2016

(65) Prior Publication Data
US 2018/0037137 A1    Feb. 8, 2018

(30) Foreign Application Priority Data

Feb. 18, 2015   (LU) .......................... 92658

(51) Int. Cl.
*B60N 2/00* (2006.01)
*B60R 21/015* (2006.01)
*B60N 2/56* (2006.01)

(52) U.S. Cl.
CPC ........... *B60N 2/002* (2013.01); *B60N 2/5685* (2013.01); *B60R 21/0154* (2014.10); *B60R 21/01532* (2014.10)

(58) Field of Classification Search
CPC ............ B60R 21/015; B60R 21/01512; B60R 21/01516; B60R 21/01524;
(Continued)

(56) References Cited

U.S. PATENT DOCUMENTS 8,138,772 B2 *  3/2012  McDonnell .......... H05B 1/0238
                                                        324/658
8,237,455 B2 *  8/2012  Griffin ............... G01G 19/4142
                                                        324/658
(Continued)

FOREIGN PATENT DOCUMENTS

| DE | 4110702 A1 | 10/1992 |
| EP | 1813480 A2 | 8/2007 |
| EP | 2548762 A1 | 1/2013 |
| WO | WO0038958 A | 7/2000 |
| WO | WO0104648 A1 | 1/2001 |

OTHER PUBLICATIONS

J. Smith et al., Electric field sensing for graphical interfaces, IEEE Comput. Graph. Appl., 18(3): 1998, pp. 54-60.
International Search Report for International application No. PCT/EP2016/052072, dated Apr. 13, 2016, 4 pages.
Written Opinion for International application No. PCT/EP2016/052072, dated Apr. 13, 2016, 5 pages.

*Primary Examiner* — Van Trieu
(74) *Attorney, Agent, or Firm* — Reising Ethington P.C.

(57) ABSTRACT

A vehicle seat occupancy detection system includes at least one capacitive sensor member having at least one sensing electrode, an impedance measurement circuit for determining a complex impedance or a complex admittance of the at least one sensing electrode, an evaluation unit for generating an output signal based on a determined complex admittance of the at least one sensing electrode and comparison of the determined complex admittance to at least one predetermined value, and at least one electrically conductive ground
(Continued)

connecting member that is intentionally electrically connected to the reference electrode and that is arranged in close proximity to the at least one sensing electrode. The at least one ground connecting member and the at least one sensing electrode are galvanically separated such that, when the seat gets wet, the sensing electrode is directly electrically connected to the reference electrode by the at least one ground connecting member.

10 Claims, 4 Drawing Sheets

(58) Field of Classification Search
CPC .......... B60R 21/0153; B60R 21/01532; B60R 21/01534; B60R 21/0154; B60N 2/002; B60N 2/005; B60N 2/5678; B60N 2/5685
See application file for complete search history.

(56) References Cited

U.S. PATENT DOCUMENTS

| | | | |
|---|---|---|---|
| 8,882,142 B2* | 11/2014 | Lamesch | B60N 2/002 |
| | | | 180/271 |
| 8,957,689 B2* | 2/2015 | Virnich | B60N 2/002 |
| | | | 324/684 |
| 9,244,576 B1* | 1/2016 | Vadagave | E05B 77/26 |
| 2010/0301880 A1* | 12/2010 | Stanley | B60R 21/01532 |
| | | | 324/686 |

* cited by examiner

CAPACITIVE SEAT OCCUPANCY DETECTION SYSTEM OPERABLE AT WET CONDITIONS

TECHNICAL FIELD

The invention relates to a capacitive seat occupancy detection system, in particular a vehicle seat occupancy detection system, and a seat, in particular a vehicle seat, including such vehicle seat occupancy detection system.

BACKGROUND OF THE INVENTION

Vehicle seat occupancy detection systems are nowadays widely used in vehicles, in particular in passenger cars, for providing a seat occupancy signal for various appliances, for instance for the purpose of a seat belt reminder (SBR) system or an activation control for an auxiliary restraint system (ARS). Seat occupancy detection systems include seat occupancy sensors that are known to exist in a number of variants, e.g. based on capacitive sensing.

Further, vehicle seat occupancy detection systems are known to be employed as a means of assessing a potential activation of an installed vehicle passenger restraint system, such as an airbag. An output signal of the seat occupancy detection system is usually transferred to an electronic control unit of the vehicle to serve, for instance, as a basis for a decision to deploy an air bag system to the vehicle seat.

It is further known in the art to use a portion of an electric seat heater of a vehicle seat as a sensor in a capacitive seat occupancy detection system. For example, patent application publication DE 41 10 702 A1 describes a vehicle seat with an electric seat heater comprising a conductor which can be heated by the passage of electrical current through it. The conductor is located in the seating surface and forms a part of a capacitive sensor for detecting a seat occupancy of the seat.

Seat occupancy detection systems based on capacitive sensing are based on determining a change in complex impedance Z or admittance Y of at least one sensing electrode of a capacitive sensor that is caused by an object approaching the sensing electrode. A seat occupancy detection or a seat occupancy classification may be determined by comparison of a measured complex impedance Z or admittance Y of the sensing electrode with predetermined threshold values and/or predetermined tolerance ranges.

The predetermined threshold values and/or predetermined tolerance ranges are usually defined for dry ambient conditions in the surroundings of the sensing electrode, as it is reasonable to presume that there is no liquid water present in the seat. The term "dry", as used in this application, shall particularly be understood as an absence of liquid water and shall encompass a presence of water vapor in a range of 0% to 100% relative humidity. The term "wet", as used in this application, shall in particular be understood as a condition encompassing a presence of liquid water.

However, situations exist in which a seat or a portion of the seat could get wet. This may happen, for instance, if a vehicle seat occupant spills a liquid, such as water or coffee, on the seat.

Wth portions of the seat having gotten wet that are arranged close to the sensing electrode, the measured complex impedance Z or admittance Y of the sensing electrode can substantially be changed, even so much so that the comparison of a measured complex impedance Z or admittance Y with the predetermined threshold values and/or predetermined tolerance ranges can lead to a wrong assessment concerning seat occupancy conditions or seat occupancy classes. As the liquid water distributes within the seat over time, the effect on the measured complex impedance Z or admittance Y of the sensing electrode also varies in an unpredictable manner.

SUMMARY

It is therefore desirable to provide a seat occupancy detection system with improved robustness and performance no matter if wet or dry conditions exist close to the sensing electrode. This object may e.g. be achieved by a seat occupancy detection system as claimed in claim 1.

In one aspect of the present invention, the above-noted object is achieved by a capacitive seat occupancy classification system, in particular a vehicle seat occupancy detection system, which comprises
  at least one capacitive sensor member having at least one sensing electrode,
  an impedance measurement circuit for determining a complex impedance or a complex admittance of the at least one sensing electrode relative to a reference electrode, and
  an evaluation unit that is configured for generating an output signal that is representative of at least one out of a detecting and of a classifying of a seat occupancy.

The output signal of the evaluation unit is based on a determined complex impedance or a determined complex admittance of the at least one sensing electrode and comparison of the determined complex impedance or the determined complex admittance to at least one predetermined value for the determined complex impedance or the determined complex admittance.

The seat occupancy classification system further includes at least one electrically conductive ground connecting member that is intentionally electrically connected/connectable to the reference electrode and that is arranged in close proximity to the at least one sensing electrode. At the same time, the at least one ground connecting member and the at least one sensing electrode are galvanically separated.

This aspect of the invention is based on the insight that a determined complex impedance or complex admittance of the at least one sensing electrode may lie outside a tolerance band or on a wrong side of a threshold level, which are predetermined for instance for a distinction between class "adult" and class "child seat" for a condition of a dry seat, due to undefined and unintended additional electrical paths between the at least one sensing electrode and the reference electrode, which for instance may be an electrically conductive part of the seat, and that this effect can be at least partially compensated by an intentional and defined electrical path between the at least one sensing electrode and the reference electrode provided by an appropriately designed at least one ground connecting member.

Thus, for the condition of the dry seat the seat occupancy detection system can operate in the intended manner, and the at least one electrically conductive ground connecting member is not effective. As soon as the seat gets wet, the at least one ground connecting member and at least the surroundings of the at least one sensing electrode will also get wet, and the at least one sensing electrode will be directly electrically connected to the reference electrode by the at least one ground connecting member, making the effects of the undefined and unintended additional electrical paths meaningless.

As will be readily appreciated by those skilled in the art, besides geometrical design, a specific electrical resistivity of the at least one electrically conductive ground connecting member constitutes another design parameter of the capacitive seat occupancy detection system.

In this way, a capacitive seat occupancy detection system can be provided with improved robustness and performance at dry as well as wet seat conditions.

The term "vehicle", as used in this application, shall particularly be understood to encompass passenger cars, trucks and buses.

The term "electrically connected", as used in this application, shall be understood to encompass galvanic electrical connections as well as connections established by capacitive and/or inductive electromagnetic coupling.

The term "galvanic contact", as used in this application, shall particularly be understood as an electrical contact that is able to conduct a direct current (DC). In the same sense, the term "galvanically separated", as used in this application, shall particularly be understood to not conduct a direct current (DC) between galvanically separated objects.

The term "in close proximity", as used in this application, shall particularly be understood as a distance that is small in comparison to at least one dimension of extension of the at least one sensing electrode.

The seat occupancy classification may comprise at least two classes selected out of a group formed by classes "empty", "child seat" and "adult".

Preferably, the at least one capacitive sensor is operated in loading mode. The term "loading mode", as used in this application, shall be understood particularly as a mode of measuring a displacement current caused by the presence of a grounded object in proximity of a single sense electrode (cf. J. Smith et al., Electric field sensing for graphical interfaces, IEEE Comput. Graph. Appl., 18(3):54-60, 1998). In general, it is also contemplated to operate the at least one capacitive sensor in transmit mode or in shunt mode in some embodiments. Both these modes are also described in the above-mentioned article, which shall hereby be incorporated by reference.

In some embodiments, the at least one capacitive sensor member may be designed as a guard-sense capacitive sensor, having a sensing electrode and a guard electrode proximally arranged and mutually insulated from each other. The technique of "guarding" is well known in the art and is frequently used for intentionally masking, and thus shaping, a sensitivity regime of a capacitive sensor member. To this end, the impedance measurement circuit is configured to keep the guard electrode at the same electric potential as the sensing electrode in order to prevent a generation of an electric field between the sensing electrode and the guard electrode.

In some embodiments, the reference electrode may be an electrically conductive seat frame that is connected to a ground potential, for instance a vehicle chassis.

In a preferred embodiment of the seat occupancy detection system, the at least one sensing electrode is formed by at least one electric seat heater member that is configured for heating a heatable seat by a passage of electrical current through it. This is beneficial due to an inherent strong capacitive coupling of the at least one electric seat heater member to the seat, in particular to an electrically conductive seat frame in case of a vehicle seat, and the benefit of hardware savings.

If the at least one electrically conductive ground connecting member is disposed coplanar to at least a portion of the at least one capacitive sensor member, it can be ensured with high probability that, as soon as the seat gets wet, the at least one ground connecting member and at least the surroundings of the at least one sensing electrode will also get wet, and the at least one sensing electrode will be directly connected to the reference electrode by the at least one ground connecting member.

In another preferred embodiment of the seat occupancy detection system, the at least one electrically conductive ground connecting member includes a single wire disposed in a plane and having a curved shape. The curved shape is arranged relative to the at least one sensing electrode such that a concave side of the curved shape faces an outer contour of the at least one sensing electrode. In this way, a small capacitive coupling can be achieved between the at least one electrically conductive ground connecting member and the at least one sensing electrode despite being arranged in close proximity. The small capacitive coupling can reduce an effort for appropriately designing the at least one ground connecting member.

In an especially simple and mechanically stable design, the at least one ground connecting member includes a single wire disposed in a plane and comprising two legs forming a right angle. The at least one ground connecting member is arranged relative to the at least one sensing electrode such that an apex of the right angle is further away from an outer contour of the at least one sensing electrode than the legs.

Preferably, the legs of the at least one ground connecting member are shaped in a straight manner.

In yet another preferred embodiment of the seat occupancy detection system, the at least one electrically conductive ground connecting member includes a single wire disposed in a plane and being arranged with at least a part of its length of extension in parallel to an outer contour of the at least one sensing electrode. In this way, a coupling between the at least one sensing electrode and the at least one electrically conductive ground connecting member is mainly capacitive, by which an effort for appropriately designing the at least one ground connecting member can be reduced.

In some embodiments of the seat occupancy detection system, the at least one electrically conductive ground connecting member comprises at least one resistor that is electrically connected in series to a balance of the at least one electrically conductive ground connecting member. In this way, another degree of freedom for the design of the at least one electrically conductive ground connecting member can beneficially be provided.

Preferably, the at least one resistor comprises a thermistor that is configured to serve as a temperature sensor, by which a hardware effort can be reduced in case of a heatable seat.

In another aspect of the invention, a vehicle seat is provided that comprises
    a seat structure for erecting the vehicle seat on a passenger cabin floor of the vehicle,
    a seat base cushion,
    at least one seat heater member that is configured for heating by a passage of electrical current through it,
    a seat base supported by the seat structure and configured for receiving the seat base cushion, the seat base and the seat base cushion being provided for supporting a bottom of a seat occupant,
    a backrest configured for taking up a backrest cushion provided for supporting a lumbar and back region of the seat occupant, and
    an embodiment of the vehicle seat occupancy detection system disclosed herein.

The at least one sensing electrode of the at least one capacitive sensor member is preferably formed by the at least one seat heater member or at least one of a plurality of seat heater members.

In this way, a heatable vehicle seat can be provided with a capacitive seat occupancy detection system having improved robustness and performance at dry as well as wet vehicle seat conditions.

In some embodiments, the at least one seat heater member is positioned at the seat cushion.

In some embodiments, the at least one seat heater member is positioned at the backrest cushion.

These and other aspects of the invention will be apparent from and elucidated with reference to the embodiments described hereinafter.

BRIEF DESCRIPTION OF THE DRAWINGS

Further details and advantages of the present invention will be apparent from the following detailed description of not limiting embodiments with reference to the attached drawing, wherein.

DESCRIPTION OF PREFERRED EMBODIMENTS

Figure 1:
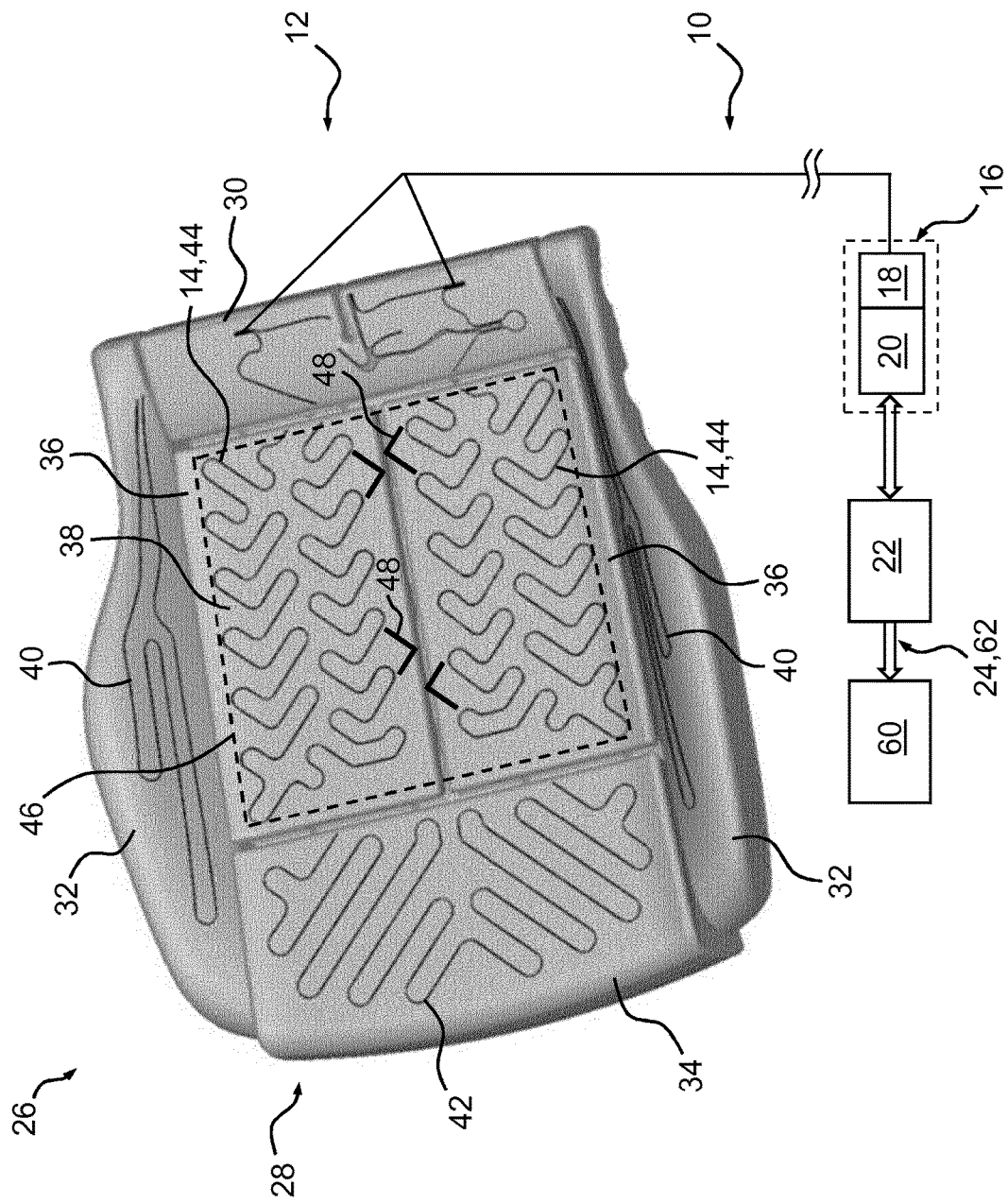
FIG. 1 is a schematic perspective illustration of a vehicle seat with an installed capacitive seat occupancy detection system in accordance with an embodiment of the invention.

FIG. 1 is a schematic perspective illustration of a vehicle seat 26 of a vehicle designed as passenger car, with an embodiment of a capacitive seat occupancy detection system 10 in accordance with the invention. The vehicle seat 26 comprises a seat structure (not shown) for erecting the vehicle seat 26 on a passenger cabin floor of the vehicle, a seat base configured for taking up a seat base cushion 28. The seat base and the seat base cushion 28 are provided for supporting a bottom of a human seat occupant. The vehicle seat 26 further includes a backrest configured for taking up a backrest cushion provided for supporting a lumbar and back region of the seat occupant. The backrest, which is not shown in FIG. 1 for reasons of clarity, is arranged at a rear edge 30 of the seat base cushion 28 shown on the right-hand side of FIG. 1.

The vehicle seat 26 includes a seat heater device (not shown) including a plurality of seat heater wires 40, 42, 44 made e.g. from Constantan® wire which are configured for heating the vehicle seat 26 by a passage of electrical current provided by the seat heater device through them, as is well known in the art. The seat heater wires 40, 42, 44 are arranged at various locations of the vehicle seat 26. One heater wire 40 each is attached to each one of two seat base cushion side members 32 that are provided for supporting the seat occupant's thighs from the side. Another heater wire 42 is attached to a seat base cushion front member 34, and two more heater wires are attached to a two-part seat base cushion center member 44, close to the A surface 38 of the seat base cushion 28.

The capacitive seat occupancy detection system 10 comprises a capacitive sensor member 12 having a sensing electrode 14 that comprises the two seat heater members 44 that are arranged at the two-part seat base cushion center member 36. Each one of the two seat heater members 44 forms a meandering pattern that is arranged in parallel to the A surface 38 of the seat base cushion center member 36. The meandering patterns formed by the two seat heater members 44 cover a major portion of the surface of the seat base cushion center member 36, which is representing a sensing area 46 of the sensing electrode 14.

Further, the capacitive seat occupancy detection system 10 includes an impedance measurement circuit 16 and an evaluation unit 22, both of which are installed remotely from the vehicle seat 26. The impedance measurement circuit 16 is electrically connected with its ports to the two seat heater members 44 that are attached to the seat base cushion center member 36. The impedance measurement circuit 16 is configured for determining a complex admittance Y of the sensing electrode 14 relative to a reference electrode.

The reference electrode is formed by the electrically conductive seat structure of the vehicle seat 26 that is connected to a ground potential represented by a body of the vehicle.

The impedance measurement circuit 16 includes a signal generating unit 18 for generating a periodic time-dependent signal that is to be applied to the capacitive sensor member 12 and a sensing circuit 20 for determining the complex admittance Y of the sensing electrode 14.

The evaluation unit 22 is configured to receive an output signal from the impedance measurement circuit 16 that is indicative of the determined complex admittance Y of the sensing electrode 14 as an input signal.

Although in this specific embodiment, the sensing circuit 20 is configured for determining the complex admittance Y of the sensing electrode 14, it is also contemplated that in another embodiment, the sensing circuit 20 may be configured for determining the complex impedance Z of the sensing electrode 14.

The real and imaginary parts of the admittance Y can be expressed in terms of the real and imaginary parts of the impedance Z, and vice versa, as those skilled in the art will readily appreciate:

with $$Y = G + j \cdot B \text{ and } Z = R + j \cdot X,$$

wherein G denotes the conductance, B the susceptance, R the resistance and X the reactance, it follows that $$G = \frac{R}{R^2 + X^2}, B = \frac{-X}{R^2 + X^2} \quad (1)$$

$$R = \frac{G}{G^2 + B^2}, X = \frac{-B}{G^2 + B^2} \quad (2)$$

The reactance $X_c$ of a capacitor of capacitance value C is given by $$X_C = -\frac{1}{2\pi \cdot f \cdot C}$$

wherein f denotes a signal frequency at which the reactance is determined.

The susceptance $B_c$ of the capacitor of capacitance value C can thus be expressed by $$B_C = \frac{2\pi \cdot f \cdot C}{(2\pi \cdot f \cdot R \cdot C)^2 + 1}$$

which for R=0 reduces to $$B_C = -\frac{1}{X_C}$$

Figure 2:
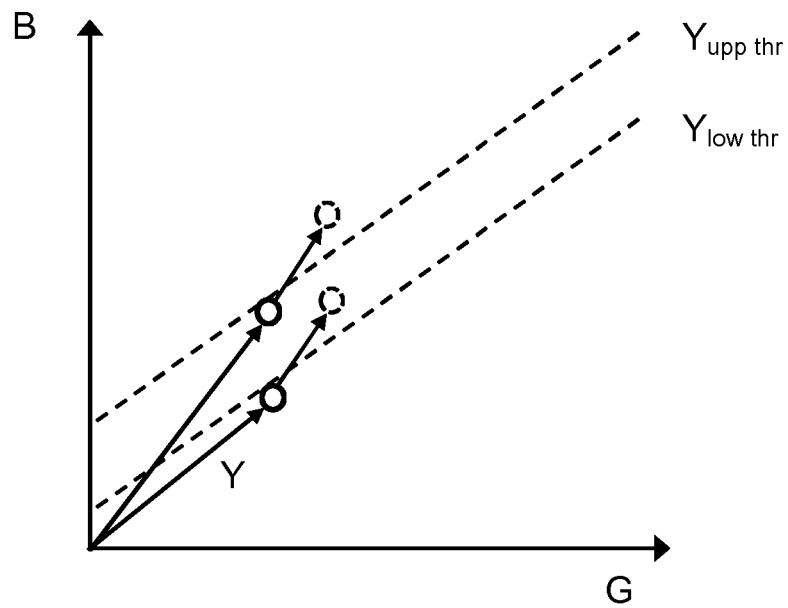
FIG. 2 in a graph shows an estimated shift of a complex admittance Y as to be determined by an impedance measurement circuit of the capacitive seat occupancy detection system pursuant to FIG. 1 between a dry state and a wet state of the vehicle seat.

The graph given by FIG. 2 schematically shows an estimated and experimentally verified shift of a complex admittance Y as determined by a conventional seat occupancy detection system, between a dry state and a wet state of the vehicle seat 26. The lower solid circle represents the complex admittance of the empty vehicle seat 26 in the dry state. The upper solid circle represents the complex admittance corresponding to the 5%-percentile female seat occupant occupying the vehicle seat 26 in the dry state. The lower dotted-line circle represents the complex admittance in the wet state of the vehicle seat 26. The upper dotted-line circle represents the complex admittance corresponding to the 5%-percentile female seat occupant occupying the vehicle seat 26 in the wet state. The lower dashed line represents lower predetermined values $Y_{low\ thr}$ for the determined complex admittance of the sensing electrode corresponding to a seat occupancy sub-class "female adult". The upper dashed line represents upper predetermined values $Y_{upp\ thr}$ for the determined complex admittance of the sensing electrode corresponding to the occupancy sub-class "female adult".

Moreover, the evaluation unit 22 of the proposed capacitive seat occupancy detection system 10 is configured for generating an output signal 24 that is representative of a classifying of a seat occupancy, wherein the output signal 24 is based on a determined complex admittance of the sensing electrode 14 and comparison of the determined complex admittance to predetermined lower bound values $Y_{low\ thr}$ and upper bound values $Y_{upp\ thr}$ for the determined complex admittance. The seat occupancy classification includes occupancy classes "empty", "child" and "adult". The output signal 24 generated by the evaluation unit 22 is provided to an airbag control unit 60 of the vehicle via a CAN communication link 62 for the purpose of air bag activation control. For instance, if the transferred output signal 24 represents the occupancy class "adult", an airbag of the vehicle seat 26 will be deployed.

It is obvious from FIG. 2 that in conventional capacitive seat occupancy detection systems misclassifications might occur due to the vehicle seat 26 being transferred from the dry state to the wet state. The shift is systematically directed towards higher values of G due to an increased electrical conductivity and towards higher values of B due to an increased electrically permittivity.

In order to remedy this deficiency, the proposed capacitive seat occupancy detection system 10 comprises an electrically conductive ground connecting member 48 (FIGS. 1 and 3) that is intentionally electrically connected to the reference electrode and is arranged in close proximity to the sensing electrode 14, i.e. to the two seat heater members 44 that are attached to the seat base cushion center member 36. The electrically conductive ground connecting member 48 and the sensing electrode 14 are galvanically separated from each other. The electrically conductive ground connecting member 48 may include a resistor 54 that is electrically connected in series to a balance of the electrically conductive ground connecting member 48. The resistor 54 comprises an NTC (negative temperature coefficient) resistor that is configured to serve as a temperature sensor for controlling a temperature of the heatable vehicle seat 26.

Figure 3:
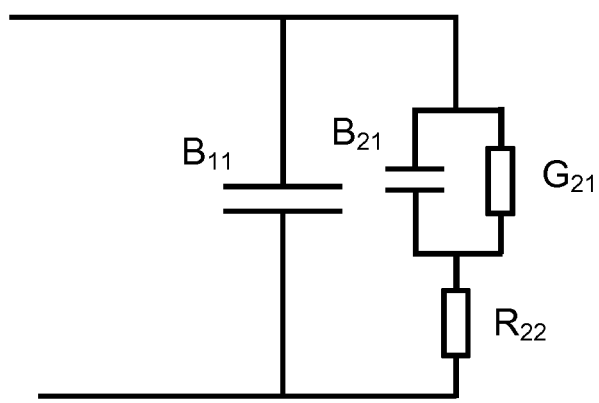
FIG. 3 is an electrical equivalent circuit of the capacitive sensor member of the capacitive seat occupancy detection system pursuant to FIG. 1, FIG. 4 schematically illustrates an embodiment of the electrically conductive ground connecting member of the capacitive seat occupancy detection system pursuant to FIG. 1 that is arranged in close proximity to the sensing electrode of the capacitive sensor member.

An electrical equivalent circuit of the disclosed arrangement is given in FIG. 3. Therein, $B_{11}$ represents the susceptance of the sensing electrode 14, i.e. the two seat heater members 44 that are attached to the seat base cushion center member 36, relative to the reference electrode, which has the electrical ground potential of the vehicle body;

$B_{21}$ represents the susceptance of the electrically conductive ground connecting member 48 relative to the sensing electrode 14;

$G_{21}$ represents the conductance between the sensing electrode 14 and the electrically conductive ground connecting member 48; and $R_{22}$ represents the resistance of the resistor 54 of the electrically conductive ground connecting member 48.

Figure 4:
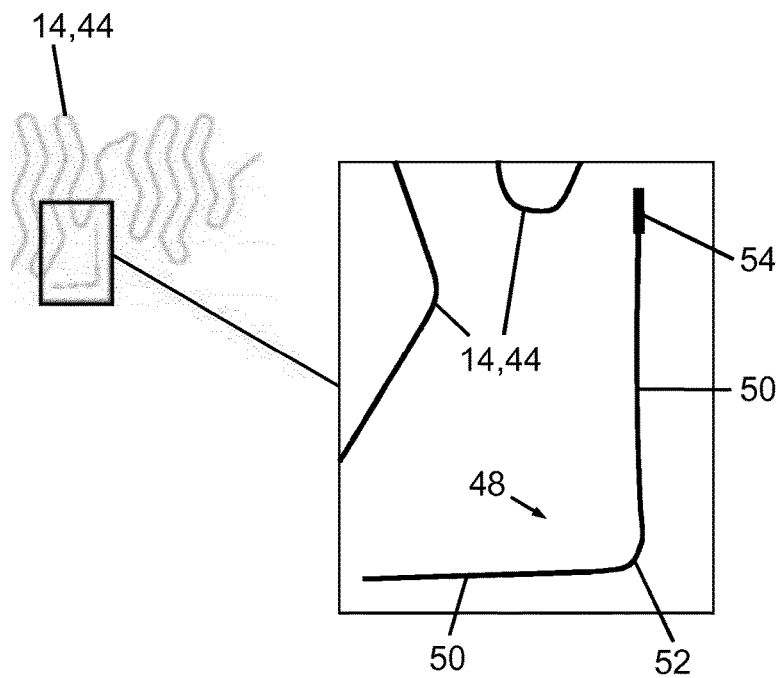

The electrically conductive ground connecting member 48 is disposed coplanar to a portion of the sensing electrode 14 and comprises a single metal wire (FIG. 4). The single wire comprises two legs 50 forming a right angle and is arranged relative to the sensing electrode 14 such that an apex 52 of the right angle is further away from an outer contour of the sensing electrode 14 than the legs 50. In another embodiment (not shown), the electrically conductive ground connecting member may have a curved shape, wherein the curved shape is arranged relative to the sensing electrode such that a concave side of the curved shape faces an outer contour of the sensing electrode. In some embodiments (not shown), the shape of the electrically conductive ground connecting member may be monotonously curved.

Due to a low capacitive coupling between the electrically conductive ground connecting member 48 and the sensing electrode 14, an admittance Y of the electrically conductive ground connecting member 48 is dominated by the conductance term $G_{21}$, and the susceptance term $B_{21}$ is negligible.

Figure 5:
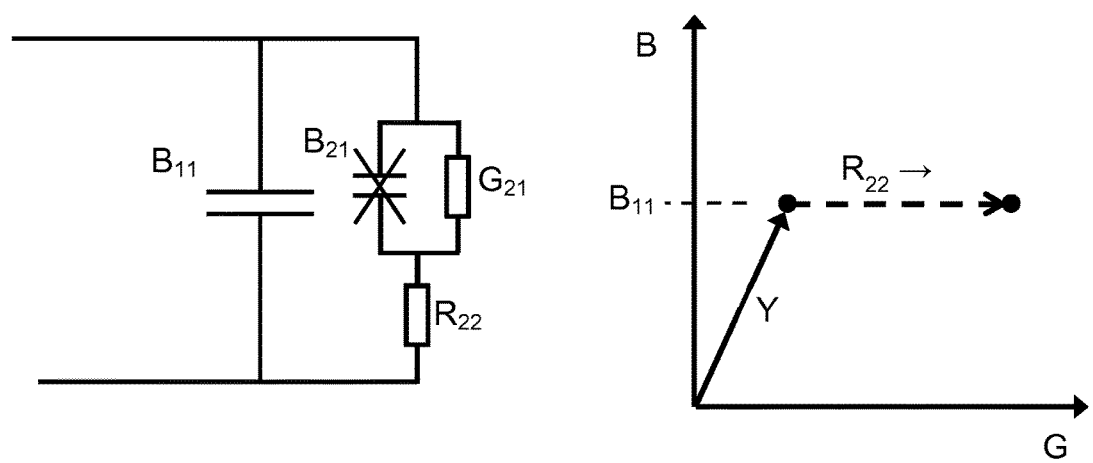
FIG. 5 is a schematic illustration of an expected effect of the embodiment of the electrically conductive ground connecting member pursuant to FIG. 4, FIG. 6 schematically illustrates an alternative embodiment of an electrically conductive ground connecting member that is arranged in close proximity to the sensing electrode of the capacitive sensor member of the capacitive seat occupancy detection system pursuant to FIG. 1.

This is schematically illustrated in FIG. 5. The dashed arrow represents the development of the complex admittance Y of the sensing electrode 14 for values of the resistance $R_{22}$ from infinite (begin of arrow) to 0 (tip of arrow).

By way of calibration, the value for the resistance R22 is selected such that the complex admittance Y of the sensing electrode 14 is adjusted by the above-described arrangement so as to lie within a bandwidth of predetermined values $Y_{low\ thr}$, $Y_{upp\ thr}$ for the determined complex admittance of a desired classification as soon as the vehicle seat 26 gets wet, the electrically conductive ground connecting member 48 and surroundings of the sensing electrode 14 get wet, and the sensing electrode 14 is directly electrically connected to the reference electrode by the at least one ground connecting member 48.

Figure 6:
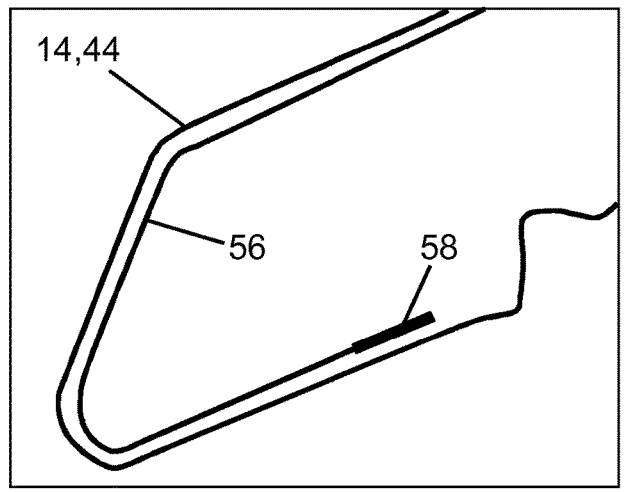

FIG. 6 schematically illustrates an alternative embodiment of an electrically conductive ground connecting member 56 that is arranged in close proximity to the sensing electrode 14 of the capacitive sensor member 12 of the capacitive seat occupancy detection system 10.

The electrically conductive ground connecting member 56 comprises a single metal wire that is disposed coplanar to a portion of the sensing electrode 14. The single wire is arranged with a part of its length of extension in parallel to an outer contour of the sensing electrode 14 that is curved multiple times, so as to achieve maximum capacitive coupling.

Due to a large capacitive coupling between the electrically conductive ground connecting member 56 and the sensing electrode 14, an admittance of the electrically conductive ground connecting member 56 is dominated by the susceptance term $B_{21}$, and the conductance term $G_{21}$ is negligible.

Figure 7:
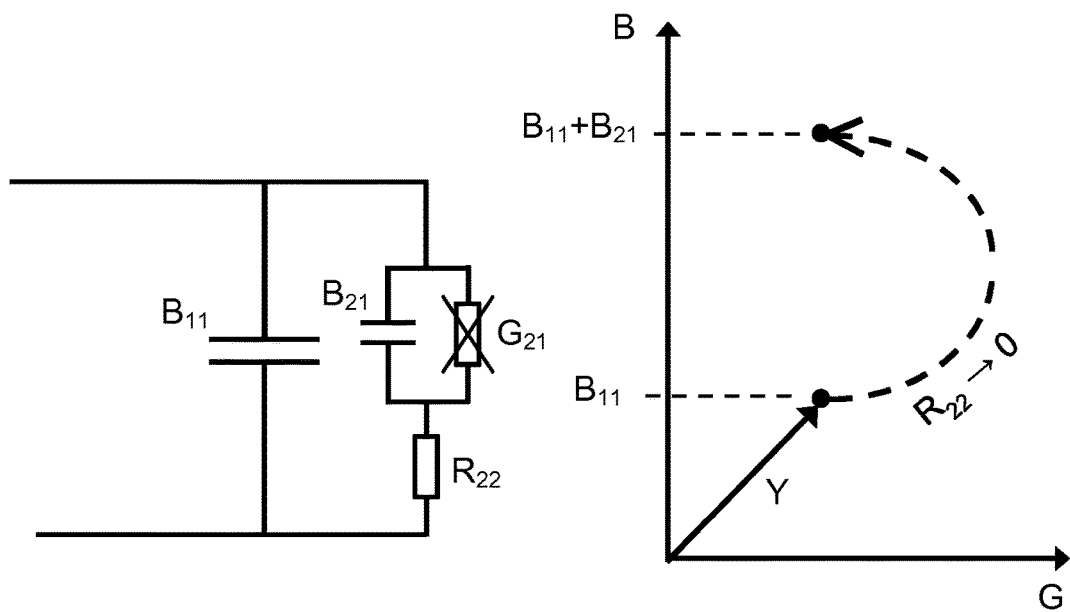
FIG. 7 is a schematic illustration of an expected effect of the alternative embodiment of the electrically conductive ground connecting member pursuant to FIG. 6.

This is schematically illustrated in FIG. 7. The dashed circular arrow represents the development of the complex admittance Y of the sensing electrode 14 for values of the resistance $R_{22}$ from infinite (begin of arrow) to 0 (tip of arrow).

By way of calibration, the value for the resistance $R_{22}$ is selected such that the complex admittance Y of the sensing electrode 14 is adjusted by the above-described arrangement so as to lie within a bandwidth of predetermined values $Y_{low\ thr}$, $Y_{upp\ thr}$ for the determined complex admittance of a desired classification as soon as the vehicle seat 26 gets wet, the electrically conductive ground connecting member 56 and surroundings of the sensing electrode 14 get wet, and the sensing electrode 14 is directly electrically connected to the reference electrode by the at least one ground connecting member 56.

While the invention has been illustrated and described in detail in the drawings and foregoing description, such illustration and description are to be considered illustrative or exemplary and not restrictive; the invention is not limited to the disclosed embodiments.

Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

The invention claimed is:

1. A capacitive seat occupancy detection system, comprising
   at least one capacitive sensor member having at least one sensing electrode,
   an impedance measurement circuit configured to determine a complex impedance or a complex admittance (Y) of the at least one sensing electrode relative to a reference electrode,
   an evaluation unit that is configured to generate an output signal that is representative of at least one of detecting and classifying a seat occupancy, the output signal being based on a determined complex impedance or a determined complex admittance of the at least one sensing electrode and a comparison of the determined complex impedance or the determined complex admittance to at least one predetermined value for the determined complex impedance or the determined complex admittance, and
   at least one electrically conductive ground connecting member that is electrically connected to the reference electrode and that is arranged in close proximity to the at least one sensing electrode, wherein the at least one ground connecting member and the at least one sensing electrode are galvanically separated.

2. The seat occupancy detection system as claimed in claim 1, wherein the at least one sensing electrode is formed by at least one seat heater member that is configured for heating a heatable seat by a passage of electrical current through the at least one seat heater member.

3. The seat occupancy detection system as claimed in claim 1, wherein the at least one electrically conductive ground connecting member is disposed coplanar to at least a portion of the at least one sensing electrode.

4. The seat occupancy detection system as claimed in claim 1, wherein each at least one electrically conductive ground connecting member includes a single wire disposed in a plane and having a curved shape, and wherein the curved shape is arranged relative to the at least one sensing electrode such that a concave side of the curved shape faces an outer contour at least one sensing electrode.

5. The seat occupancy detection system as claimed in claim 1, wherein each at least one electrically conductive ground connecting member includes a single wire disposed in a plane, and wherein the single wire comprises two legs forming a right angle, and is arranged relative to the at least one at least one sensing electrode such that an apex of the right angle is further away from an outer contour of the at least one sensing electrode than the legs.

6. The seat occupancy detection system as claimed as claimed in claim 1, wherein each at least one electrically conductive ground connecting member includes a single wire disposed in a plane and being arranged with at least a part of its length of extension in parallel to an outer contour of the at least one sensing electrode.

7. The seat occupancy detection system as claimed in claim 1, wherein the at least one electrically conductive ground connecting member comprises at least one resistor that is electrically connected in series to a balance of the at least one electrically conductive ground connecting member.

8. The seat occupancy detection system as claimed in claim 7, wherein the at least one resistor comprises a thermistor that is configured to serve as a temperature sensor.

9. A vehicle seat, comprising
   a seat structure for erecting the vehicle seat on a passenger cabin floor of the vehicle,
   a seat base cushion,
   at least one seat heater member that is configured for heating by a passage of electrical current through the at least one seat heater member,
   a seat base supported by the seat structure and configured to receive the seat base cushion, the seat base and the seat base cushion being provided for supporting a bottom of a seat occupant,
   a backrest configured to receive a backrest cushion provided for supporting a lumbar and back region of the seat occupant, and a vehicle seat occupancy detection system as claimed in claim 1, wherein the at least one sensing electrode is formed by the at least one seat heater member.

10. A seat occupancy detection method, comprising detecting occupancy of a vehicle seat using the capacitive seat occupancy detection system set forth in claim 1.

* * * * *